United States Patent

Model et al.

[11] 4,012,695
[45] Mar. 15, 1977

[54] METHOD AND APPARATUS FOR QUALITY CONTROL OF SEMICONDUCTOR DEVICES AND INTEGRATED CIRCUITS

[76] Inventors: Evgenia Iosifovna Model, Moskovskaya ulitsa, 12, kv. 50, Khimki, Moskovskoi oblasti; Anna Sergeevna Savina, Gospitalny val, 3, korpus 3, kv. 44; Jury Lvovich Nurov, ulitsa Chaikovskogo, 18, kv. 84, both of Moscow; Alexandr Nikolaevich Piorunsky, Orshanskaya ulitsa, 4, kv. 59; Boris Efimovich Fedorov, Leninsky prospekt, 34, kv. 368, both of Moscow; Vladimir Mikhailovich Ivanov, Samarkandsky bulvar, 6, korpus 2, kv. 150, Moscow, all of U.S.S.R.

[22] Filed: Apr. 5, 1974

[21] Appl. No.: 458,398

[52] U.S. Cl. .................... 324/158 D; 324/158 F
[51] Int. Cl.² ..................................... G01R 31/22
[58] Field of Search ............... 324/158 D, 158 T

[56] References Cited

UNITED STATES PATENTS 3,622,883  11/1971  Haire .................. 324/158 T

OTHER PUBLICATIONS

Lutz, O. P., "A Semiautomatic Test . . . ," Solid State Technology; Apr. 1969; pp. 39–43.

*Primary Examiner*—R. V. Rolinec
*Assistant Examiner*—Ernest F. Karlsen

[57] ABSTRACT

The present method provides for the use as criterion the coefficient *m* of a deviation of the actual current-voltage characteristic of the p-n junction of a semiconductor device or integrated circuit under test obtained by applying a varying current in the forward direction through a p-n junction. The form of a current variation is chosen such that if the p-n junction has an ideal current-voltage characteristic $$I = I_s \left( e^{\frac{V}{m\Phi T}} - 1 \right)$$

the current variation causes constant voltage increments through the p-n junction over the entire range of current values I. It means that for a p-n junction with an actual current-voltage characteristic $$I = I_s \left( e^{\frac{V}{m\Phi T}} - 1 \right)$$

the increments obtained will be constant and proportional to the coefficient *m*. The apparatus for effecting the present method comprises at least two current generators controlled by a current controller, ensuring interrelated currents at their outputs. The current controller ensures that relative variations of each of the currents are equal. A switching element connects the outputs of the generators alternately to the p-n junction. The variable component of the voltage obtained at the junction is converted by a voltage converter to an electrical signal which is applied to a recorder. The present method and apparatus are used for detecting unreliable semiconductor devices and integrated circuits.

16 Claims, 11 Drawing Figures

METHOD AND APPARATUS FOR QUALITY CONTROL OF SEMICONDUCTOR DEVICES AND INTEGRATED CIRCUITS

The present invention relates to the measuring technique and, more particularly, to a method and apparatus for quality control of semiconductor devices and integrated circuits to be mainly used for detecting potentially unreliable semiconductor devices and integrated circuits having p-n junction during the process of their manufacture, substantially at intermediate and final stages of this process. The method can also be used for the acceptance check of semiconductor devices and integrated circuits at electronic equipment manufacturing works, where particularly stringent requirements are placed on the reliability and life of semiconductor devices and integrated-circuit components. The invention is particularly useful when checking integrated circuits having been already mounted into a housing without a direct access to their p-n junction, where it is possible to connect the measuring instruments to these junctions through internal resistive circuits connected to the external terminals of the integrated circuits.

Known in the prior art is a method for controlling the quality of semiconductor devices and integrated circuits having at least one p-n junction, wherein a varying electric current is fed through this p-n junction for measuring a parameter to be used as a quality criterion of a given semiconductor device or integrated circuit.

By this method an electric current is passed through a p-n junction in a reverse direction, and the slope of the current-voltage characteristic is measured, to be used as a parameter for estimation of the presence of current paths on the surface of the p-n junction, as well as the shunting thereof due to the leakage current, i.e. estimation of the quality of the semiconductor devices and integrated circuits having a p-n junction. As a measure of this slope, there is used the ratio of the difference in two values of the voltage drop $U_1$ and $U_2$ across the p-n junction occurring as a result of the passage of two known currents through this p-n junction to the difference in these currents, i.e.

$$\frac{U_1 - U_2}{I_1 - I_2} = \frac{\Delta U}{\Delta I}$$

However, the coefficient of the slope of the current-voltage characteristic for a silicon p-n junction in the region of the reverse currents allows rather rough evaluation of the defects of a p-n junction due to the absence of the saturation area in principle which is inherent for germanium p-n junctions. Due to low informative value of the coefficient of the slope of the current-voltage characteristic or a silicon p-n junction in the reverse current region its application for quality control by way of comparing with a reference current-voltage characteristic is rather inefficient.

Known in the art is an apparatus for effecting the method for quality control of semiconductor devices and integrated circuits comprising a current generator which is connected to the p-n junction of the semiconductor device or integrated circuit via a switching element, a recorder being electrically connected to said generator.

In this apparatus the recorder comprises two memory voltmeters which are alternately connected to the p-n junction synchronously with two predetermined currents passed through the same junction, said voltmeters measuring the voltage drops across the p-n junction caused by these currents. Thus, the apparatus makes it possible to obtain high values of the voltage drops $U_1$ and $U_2$ caused by known currents $I_1$ and $I_2$, respectively, and therefore, to calculate the slope of the current-voltage characteristic of the p-n junction. However the slope of the current-voltage characteristic defined as $$\frac{U_1 - U_2}{I_1 - I_2} = \frac{\Delta U}{\Delta I}$$

represents the differential resistance of the p-n junction at some point of the current-voltage characteristic specified by the average current $(I_1 + I_2)/2$ in an ordinary linear scale.

As it was shown hereinabove, the slope of the current-voltage characteristic of the p-n junction in the linear scale, i.e. its differential resistance, is a parameter of low informative value so that its use is inexpedient.

It is an object of the present invention to provide a method and apparatus for quality control of semiconductor devices and integrated circuits ensuring high reliability of the results of this control and providing the possibility of measurement with direct reading of this physical parameter without performing additional calculations.

This object is accomplished due to the fact that in a method for quality control of semiconductor devices and integrated circuits having at least one p-n junction, comprising passing a varying current through the p-n junction and measuring a parameter to be used for evaluating the quality of the devices and circuits, according to the invention, the parameter used for evaluating quality is a coefficient $m$ of deviation of the actual current-voltage characteristic obtained when passing the current through the p-n junction from the ideal one lying within the range of $m_{min} \leq m \leq m_{max}$, where $m_{min} \leq 1$, $m_{max} \geq 2$, the current being passed in the forward direction in the range defined by the relationship:

$$I/U \geq 4\Phi_T < I < \frac{\Phi_T}{R_b},$$

wherein
  $U$ is voltage drop across the p-n junction;
  $\phi_T$ is thermal potential equal to $kT/q$;
  $R_b$ is resistance in the base circuit of the p-n junction including the external resistance;
with subsequent measurement of voltage increments across the p-n junction caused by these currents, said voltage increments being proportional to the coefficient $m$ of deviation.

The current flowing through the p-n junction in the forward direction is preferably selected to have such a form that as to provide for constant voltage increments across a p-n junction with an ideal current-voltage characteristic, the magnitude of variation of these increments for p-n junctions of the semiconductor devices and integrated circuits being tested carrying information of the value of the coefficient $m$.

The current flowing through the p-n junction preferably has a form defined by the presence of DC and AC components, the ratio between these components being kept constant, while the value of the coefficient $m$ is evaluated by the amplitude of the AC component of the voltage across the p-n junction.

This form of current flowing through the p-n junction can be obtained, for example, by alternately connecting two current generators (one of them is a main generator and the other one is an additional one) to the p-n junction, the current values of the generators beng interrelated in such a way that the relative variations of their currents are equal. This interrelation is ensured by the use of one current controller common for both generators.

The current flowing through the p-n junction preferably has a form of exponential pulses, the voltage pulses appearing across the p-n junction being differentiated, while the value of the coefficient $m$ is evaluated by the instantaneous values of the amplitude of the pulses obtained after the differentiation.

This object is also accomplished due to the fact that in an apparatus for effecting the method for quality control of semiconductor devices and integrated circuits comprising a current generator which is connected to the p-n junction of the semiconductor device or integrated circuit via a switching element and is electrically coupled to a recorder, according to the invention, there is provided at least one additional current generator whose control input is connected to that of the main generator and which is alternately connected, via a switching element, to the p-n junction together with the main generator; a current controller whose output is connected to the control inputs of these generators and generates a signal ensuring the equality of relative current variation at the outputs of said generators; means for recording mean value of the current flowing through the p-n junction, said means being connected in parallel with said controller; and a voltage converter converting the voltage taken from the p-n junction into an electric signal having a conversion factor depending on the form of the current flowing through the p-n junction and on its mean value and electrically coupling the p-n junction of the semiconductor device or integrated circuit and a recorder recording the value of the coefficient $m$.

The voltage converter is preferably electrically coupled to the output of the current controller.

When passing through the p-n junction the current, whose form is defined by the presence of DC and AC components, the main and additional current generators are preferably comprised of an operational amplifier having a negative feedback circuit into which there is inserted the p-n junction of the semiconductor device or integrated circuit being tested is a resistive quadripole connected to the input of this amplifier, said quadripole providing for the alternate passage of two interdependent currents through said p-n junction; these two current values are related in such a way that when one current varies the other one varies too and their relative variations are equal under the effect of the current controller common for both current generators, the current controller comprising a voltage generator, and the voltage converter comprising an AC voltage amplifier with a gain proportional to the ratio of the mean value of the current to the difference in the input currents of the operational amplifier.

When passing the current having a form of exponential pulses through the p-n junction, the main and additional current generators are preferably comprised of an operational amplifier having a negative feedback circuit including the p-n junction of the semiconductor device or integrated circuit being tested, the input of said amplifier being connected to a quadripole comprised of reactive and active elements or nonlinear elements, said quadripole, together with the controller and a switching element, providing for the passage of an electric current having a form of exponential pulses through the p-n junction, and the voltage converter comprising a differentiating unit.

With the quadripole comprised of nonlinear elements, the differentiating unit is preferably provided with a summing amplifier or with a differentiating amplifier whose input is connected to the input of the differentiating unit, and the output is connected to the input of a recorder effecting an additional electric coupling of the voltage converter with the current controller.

The method for quality control of semiconductor devices and integrated circuits having p-n junctions according to the invention provides for improved reliability of the control makes it possible to test the integrated circuits enclosed into a housing where the direct access to the p-n junction required by other control methods is often impossible. The coefficient of deviation of the current-voltage characteristic of the p-n junction from the ideal (exponential) characteristic selected as quality criterion in accordance with the method according to the invention enables the efficient evaluation of the state of the surface of p-n junctions (the presence of current paths, inversion layers), of the surface defining the service life of the semiconductor devices and integrated circuits.

The apparatus according to the invention for effecting the above-described method is well adapted for the development of automatic systems for quality control of semiconductor devices and integrated circuits which are capable of performing at a rate of control covering the needs of the mass-scale production. The apparatus enables the direct reading of the coefficient $m$ of deviation on the dial of a recording means which may comprise any known analog or digital voltmeter. The circuitry of the proposed apparatus is extremely simple and this guarantees its high reliability and low cost.

Other objects and inherent advantages of the invention will be apparent from the following detailed description of some embodiments of the invention, reference being made to the accompanying drawings, in which.

Figure 1:
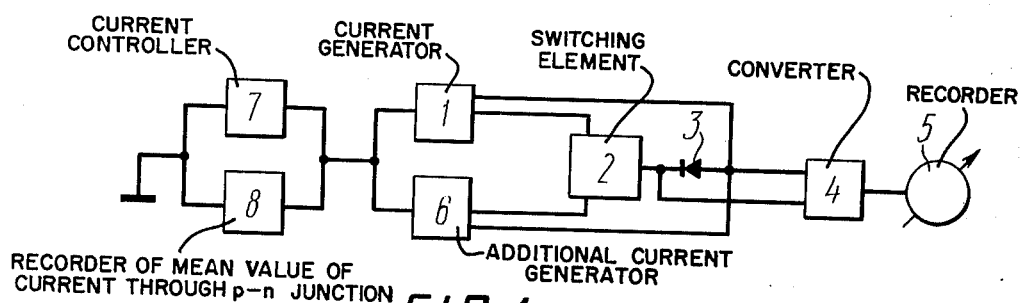
FIG. 1 is a block diagram of the apparatus according to the invention for effecting the method for quality control of semiconductor devices and integrated circuits.

For a better understanding of the spirit of the invention, given hereinbelow are theoretical backgrounds.

Known in the art are methods of non-destructive quality control of semiconductor devices: X-ray and infrared flaw detection, a method of evaluation of the quality of semiconductor devices on the basis of their noise parameters, a method of quality control by the form of the current-voltage characteristic of the p-n junctions of semiconductor devices biased in the reverse direction. The electrical methods of quality control of semiconductor devices consisting in measurement of the noise parameters of their p-n junctions and investigation of their current-voltage characteristics in the region of reverse bias are of a poor information value.

This is explained by the fact that the noise parameters are poorly reproducible when repeatedly measured. The current-voltage characteristics of the inversely-biased p-n junctions can scarsely be standardized, particularly for silicon semiconductor devices which in principle have no area of saturation on the back branch of the current-voltage characteristic.

It is known that the most important factor affecting the service life of semiconductor devices is the state of the surface of their p-n junctions. Although the noise parameters and the shape of the current-voltage characteristic of the p-n junction are correlated with the state of its surface, nevertheless the evaluation of the quality using these parameters is difficult.

Further, it is known that in the region of the direct bias of the p-n junction its current-voltage characteristic does not follow the theoretical exponential dependence. In particular, it is explained by the fact that the saturation current of the p-n junction depends not only on the generation component but on some other components as well. The latter include the recombination component of the saturation current which is strongly dependent of the state of the surface.

The deviation of the current-voltage characteristic from the exponential dependence is taken into account by means of coefficient m of deviation which is introduced into the exponent of the known relationship describing the current-voltage characteristic of an ideal p-n junction $$I = I_s \left( e^{\frac{u}{m\phi_T}} - 1 \right). \tag{1}$$

wherein $I_s$ is equivalent saturation current;

U is voltage across the p-n junction;

$\phi_t = (k\tau/q)$ is thermal potential.

Owing to the fact that the recombination component has the greatest influence on the shape of the current-voltage characteristic in the region of low direct currents flowing through the p-n junction, it is herein contemplated to estimate this shape in the region of low-intensity forward currents.

This region of the currents is restricted from above and below by the relation $$I/U \quad 4\phi_T < I < \frac{\phi_T}{R_b}, \tag{2}$$

wherein

U is voltage drop across the p-n junction;

$R_b$ is equivalent resistance in the base circuit of the p-n junction, including the external resistance The restriction of the current from below by the value $U \geq 4 \phi_t$ makes it possible to eliminate the influence of the second term in the round brackets of the first expression on the results of investigation of the shape of the current-voltage characteristic.

The restriction of the current value from above by the ratio $\phi_t /R_e$ makes it possible to eliminate the influence of the voltage drop across the equivalent resistor in the base circuit of the p-n junction of the semiconductor device, including the external resistor. This voltage drop causes inequality between the external voltage and the voltage applied directly to the p-n junction thus defining its current-voltage characteristic with high injection currents. This fact affects the course of the dependence of the coefficient m on the current flowing through the p-n junction when this current is of a high value.

The value of the coefficient m in the region of low currents is a good means of indication of the state of the surface, and this is used in the method of the invention. The restriction of the upper limit of the current passed through the p-n junction not only enables the control of the quality of purely semiconductor devices but also of integrated circuits having p-n junctions coupled to their external terminals by resistors.

Theoretically, when the recombination component is predominant, as in the case of low injection currents, the coefficient m is equal to 2. When the generation component is predominant, the coefficient m is equal to 1. Therefore, the high-quality semiconductor devices or integrated circuits are those whose coefficient m of deviation of the current-voltage characteristics of their p-n junctions from the current-voltage characteristics of the ideal p-n junctions is within the range of 1 to 2.

It is the values of the coefficient m within the range of $m_{min} \leq m \leq m_{max}$, wherein $m_{min} \leq 1$, $m_{max} \geq 2$ which are selected according to the invention as criterion for evaluating the state of the surface, i.e. the quality of semiconductor devices or integrated circuits having p-n junctions. This is explained by the fact that in the case of inversion of the surface or in the presence of current paths the value of m is more than two and less than unit. In this case in the contemplated area of variation of the currents flowing through the p-n junctions extreme values of the coefficient m will be obtained for defective p-n junctions; therefore, when carrying out the method according to the invention, it is necessary to conduct the test over the entire range of currents. It should be noted that simple recording of the current-voltage characteristic in the region of the forward bias of the p-n junctions or its observation by means of characteriographs gives but very rough impression of the quality of a semiconductor device or an integrated circuit having a p-n junction, e.g. the operator can only find out whether the p-n junction is present or absent.

To obtain the information of the coefficient $m$ of deviation, it is herein contemplated to measure voltage increments across the p-n junctions when varying the currents flowing there through in the forward direction.

In this case the current passed through the p-n junction is selected to have such a form as to provide for constant voltage increments across the p-n junction with an ideal current-voltage characteristic described by an exponential relationship. Any change in these voltages across the p-n junctions of the semiconductor devices and integrated circuits being tested carries an information of the value of the coefficient $m$.

A specific embodiment of the method according to the invention characterized in that a current passed through the p-n junction has a form defined by the presence of DC and AC components, the relation between the components, being kept constant within the whole range of the mean value of the current.

The constant relationship between the DC and AC components is achieved in particular by the fact that for creating said current form, use is made of one of the techniques in conformity with the invention, the technique of alternately connecting one of said two current generators (the main generator and the additional generator) to the p-n junction, the current values of which are interdependent through the common current controller in such a way that in case of a variation in the current values of said generators the relative variations in both current values are maintained constant. Indeed, if the p-n junction is first connected to the generator with a current value $I_1 = I_{10}(1 + \delta)$, and then the other current generator with a current value $I_2 = I_{20}(1 + \delta)$ (wherein $I_{10}$ and $I_{20}$ are the initial values of said currents, $\delta = \Delta I_1/I_1 = \Delta I_2/I_2$ is the value of a relative variation of the current values within the range of current variations $I_1$ and $I_2$, and $\Delta I_1$ and $\Delta I_2$ are absolute increment values of the currents $I_1$ and $I_2$ in case of their variations), then having denoted $I = (I_1 + I_2)/2$ and $\Delta I = I_1 - I_2$, we shall have $$\frac{\Delta I}{I} = \frac{2(I_1 - I_2)}{I_1 + I_2} = \frac{2(I_{10} - I_{20})}{I_{10} + I_{20}} = \text{const},$$

the current I varying within the given range determining a point on the current-voltage characteristic of the p-n junction at which the coefficient $m$ has been measured. In this case the value of the coefficient $m$ is evaluated using the amplitude of the AC component at the p-n junction.

The method consisting in applying to a p-n junction a sum of DC and AC components with the measurement of the AC voltage across the p-n junction in known in the art. It is used for measuring the differential resistance of the p-n junction and is based on approximate differentiation of its current-voltage characteristic described by the expression $$U = m\phi_T \ln\left(\frac{I}{I_s} + 1\right) \tag{3}$$

After differentiating this expression and taking the final increments, we obtain an algorithmic expression for finding the differential resistance $$r = \frac{\Delta U}{\Delta I} = \frac{m\phi_T}{I + I_s} \tag{4}$$

or for the region of the current $I > I_s$ $$r = \frac{\Delta U}{\Delta I} \approx \frac{m\phi_T}{I} \tag{5}$$

In this case, for the purpose of measurement, the current I is constant and defines a point on the current-voltage characteristic of the p-n junction, in which $r$ is measured, while $\Delta I$ is an AC superimposed on the current I, and $\Delta U$ is the amplitude of the AC of the voltage drop across the p-n junction. In this case it is principally possible to maintain the constant value of $\Delta I$ within the whole range of variation of the current I is ensured in principle, whereby the voltage $\Delta U$ becomes proportional to $r$.

The distinguishing feature of the method of measurement of the coefficient $m$ according to the invention allowing the quality of the p-n junctions to be controlled consists in that the ratio $\Delta I/I$ is kept constant. Then $$\Delta U = m\phi_T \frac{\Delta I}{I} = c \cdot m$$

wherein $$c = \phi_T \frac{\Delta I}{I} = \text{const} \tag{6}$$

and, therefore $\Delta U$, i.e. the AC voltage drop across the p-n junction is directly proportional to the coefficient $m$, since $\phi_t$ and $\Delta I/I$ are constant.

Thus, if the current I is continuously varied in the above-specified range the AC voltage proportional to the coefficient $m$ is measured at the p-n junction, the coefficient is not exceeding $m_{max}$ and being greater than $m_{min}$ for normalgrade (potentially durable) semiconductor devices or integrated circuits, efficient quality control is possible.

In this case in order to effect accurate calibration of the recording instrument, such as an AC voltmeter, inserted between this instrument and the p-n junction is an AC voltage amplifier with a gain A equal to $$A = \frac{U_{max}}{n_{max} \cdot \phi_T} \cdot \frac{I}{\Delta I}, \tag{7}$$

wherein $U_{max}$ is measuring range of the AC voltmeter, $n_{max}$ is desirable range of measurement of the coefficient $m$ in relative integers.

Another embodiment of the method for direct measurement of the coefficient $m$ by the value of variations in the voltage increments under the action of fluctuation of the current passed through the p-n junction consists in that the current flowing through this junction has a form of exponential pulses. The voltage pulses appearing in this case across the p-n junction are differentiated, while the coefficient is evaluated on the basis of instantaneous values of the amplitude of the pulses obtained after the differentiation.

This method is based on the logarithmic dependence of the voltage across the p-n junction on the current flowing through the p-n junction. From relationship (3) is follows that if the form of the current I is described by the exponential dependence of the type $$I = I_o e^{at} \qquad 8.$$

the voltage drop across the p-n junction is linear with e.g. time parameter $t$:

$$U = m\phi_T \left( \ln \frac{I_o}{I_s} + at \right) \qquad (9)$$

Therefore, after differentiation we have $$\frac{dU}{dt} = a \cdot m \cdot \phi_T \qquad (10)$$

Owing to the fact that $a$ and $\phi_t$ represent constant values, the derivative $dU/dt$ is directly proportional to the coefficient $m$ of deviation. For the p-n junction with an ideal current-voltage characteristic the coefficient $m = 1$, therefore, $dU/dt = $ const, which means a constant increment of the voltage across the p-n junction caused by the exponentially varying current. Practically, for p-n junction the coefficient $m \neq 1$ and, consequently, $dU/dt \neq $ const. For this reason, voltage increments across the actual p-n junction are not constant and this indicates to variations of the coefficient $m$, the amount of these variations defining the degree of deficiency, that is the quality of a semiconductor device or integrated circuit having a p-n junction.

The block diagram of the proposed apparatus for effecting the quality control of semiconductor devices and integrated circuits is shown in FIG. 1. It comprises a current generator 1 (FIG. 1) connected, via a switching element 2, to a p-n junction 3 of a semiconductor device. A converter 4 of the voltage taken from the p-n junction 3 and converted into an electric signal is connected to the p-n junction 3, the conversion factor of the converter 4 being selected depending on the shape and mean value of the current flowing through the p-n junction 3. Connected to the output of the voltage converter 4 is a recorder 5.

The control input of the main generator 1 is connected to a control input of an additional current generator 6, a current controller 7 being connected to both the control inputs of the generators 1 and 6 simultaneously to generate a signal for interdependently proportionally varying the output currents of these generators 1 and 6. Connected in parallel with the controller 7 is means 8 for recording the mean value of the current flowing through the p-n junction 3, including the maximum and minimum mean values of the current defined by inequality (2).

Figure 2:
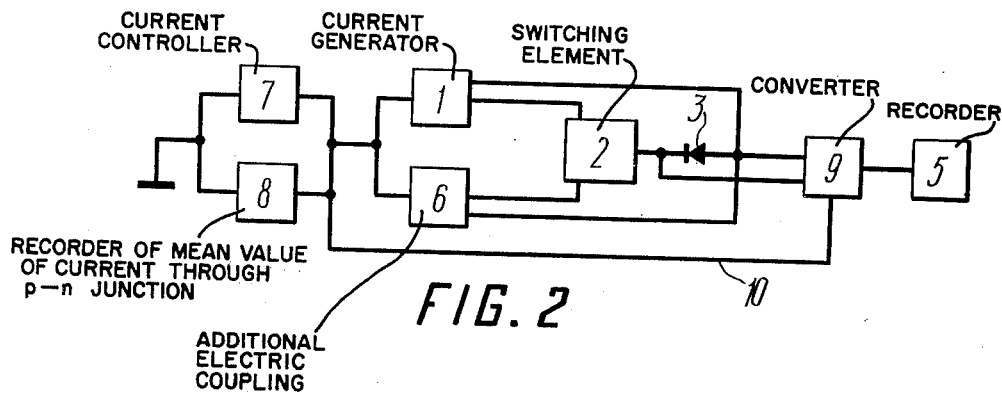
FIG. 2 is the same with an additional electric coupling between the voltage coverter and the current controller of the apparatus according to the invention.

In another embodiment of the apparatus the converter of voltage into an electric signal may be connected to the output of the controller 7 via an additional electric coupling 10 (FIG. 2).

When a current whose form is determined by the presence of DC and AC components, which in this embodiment is represented by square pulses is passed through the p-n junction 3, the main and additional generators 1 and 6 comprise an operational amplifier 11 (FIG. 3) having a negative feedback circuit including the p-n junction of the semiconductor device being tested and a resistive quadripole 12 connected to the input thereof. The quadripole 12 comprises resistors 13 and 14 and provides for a flow of two currents varying simultaneously through the p-n junction 3 by means of a switching element 2 comprising a selector switch. With such embodiment of the generators 1 and 6 the current controller 7 connected to the quadripole 12 comprises a DC voltage source (generator), and means 8 for recording the mean value of the current flowing through the p-n junction 3 is a well-known DC voltmeter.

In this embodiment the voltage converter 4 connected to the p-n junction is an AC voltage amplifier based on the integrated circuit of an operational amplifier 15 having a resistor 16 in its negative feedback circuit and a resistor 17 and a capacitor 18 connected to its input. The gain of this amplifier is thus determined by the ratio of the resistances of the resistors 16 and 17 which are selected to be proportional to the ratio of the mean (direct) current in the p-n junction 3 to the amplitude of the variable component of current (the difference between the currents), i.e., proportional to the definite value of $I/\Delta I$.

The recorder 5 recording the value of the coefficient in this embodiment of the apparatus is a well-known AC voltmeter.

In another embodiment of the abovedescribed apparatus through the p-n junction 3 there is also passed a current containing DC and AC components, and the apparatus is similar to that described above.

The only difference is in the circuit diagram of a quadripole 19 (FIG. 4) comprising resistors 13 and 14 connected in series. In this case the switching element 2 comprising a circuit breaker is connected in parallel with the resistor 14 and this represents the advantage of this embodiment.

In the third embodiment of the apparatus according to the invention a current containing DC and AC components is passed through the p-n junction 3. This embodiment is also similar to that described above.

The difference between them is also in the circuit arrangement of a quadripole 20 (FIG. 5) comprising resistors 13, 14 and 21 interconnected to form a T-shaped circuit. The resistors 13 and 14 are connected in series to couple the current controller 7 to the input of the operational amplifier 11. Inserted between the resistors 13 and 14 is a resistor 21 which is periodically connected to the "earth" through the switching element 2 comprising a circuit breaker.

The above-described system is advantageous in that it makes it possible to control the switching element 2 with reference to the earth potential.

In the three above-described embodiments of the apparatus according to the invention through the p-n junction of the semiconductor device under control there is passed a current whose AC component has a form of square pulses. In these three embodiments of the apparatus there can be used a current with an AC component in the form of sinusoidal pulses.

Figure 6:
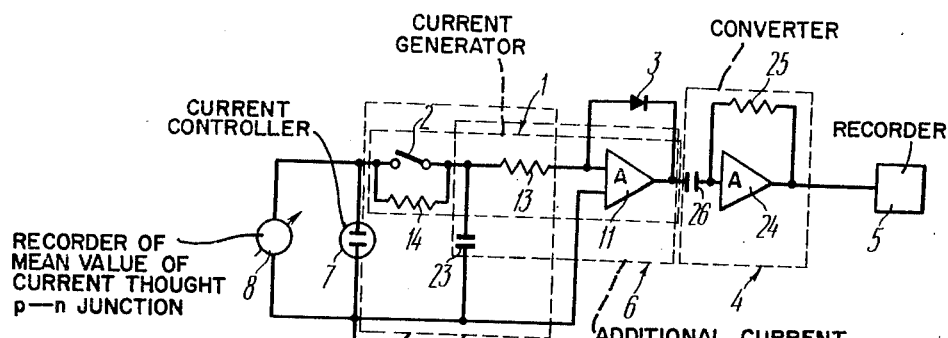
FIG. 6 is a circuit diagram of the second embodiment of the apparatus according to the invention with a quadripole comprised of active and reactive elements.

When a current having a form of exponential pulses is passed through the p-n junction 3, the main and additional current generators 1 and 6 comprise an operational amplifier 11 having the negative feedback circuit including the p-n junction 3 of the semiconductor device being tested, a quadripole 22 (FIG. 6) based on reactive and active elements being connected to the input of this amplifier (FIG. 6). In this embodiment the reactive element is a capacitor 23 inserted between the two active elements — resistors 13 and 14 which connect the input of the operational amplifier 11 to the current controller 7. Connected in parallel with the resistor 14 is a switching element 2 comprising a circuit breaker providing for a flow of two currents will vary simultaneously with variations in this voltage.

In this embodiment the current controller 7 is a DC voltage source (generator), and means 8 for recording the mean value of the current flowing through the p-n junction 3 is a DC voltmeter similar to that described above. In this embodiment the voltage converter 4 comprises a differentiating unit built around an operational amplifier 24, having the negative feedback circuit including a resistor 25 and a capacitor 26 at the input.

The recorder 5 recording the value of the coefficient $m$ in this embodiment is a well-known oscillograph.

In another embodiment of the apparatus a current having a form of exponential pluses is also passed through the p-n junction 3 similarly to that described above.

Figure 7:
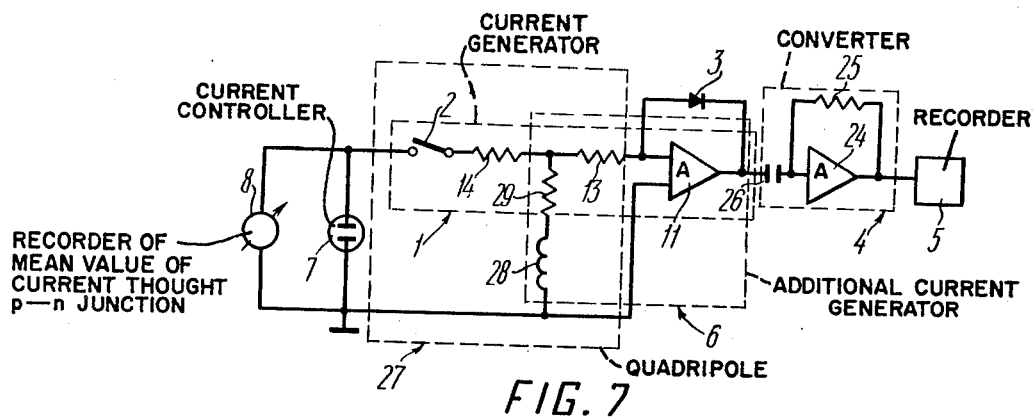
FIG. 7 is the same, with another embodiment of the quadripole.

The difference consists in the fact that an inductance coil 28 is used as reactive element of a quadripole (FIG. 7). In this case a resistor 29 is connected in series with the coil 28. The distinction also consists in that the switching element 2 is connected in series with the resistor 14.

In still another embodiment of the apparatus a current having a form of exponential pulses is passed through the p-n junction 3 similarly to that described above.

Its distinction consists in that a quadripole 3 (FIG. 8) comprises a nonlinear element, such as a diode 31 featuring an exponential dependence of the current on the applied voltage, and active elements comprising resistors 32 and 33. The diode 31 is inserted into a series circuit with a resistor 32, with a switching element 2 comprising a circuit breaker connected in parallel therewith, said circuit connecting the input of the operational amplifier 11 to the current controller 7. In this embodiment the current generator 7 is a sawtooth-voltage generator based on the known circuit of an integrator built around an operational amplifier 34 having a negative feedback circuit including a capacitor 35, the input of said operational amplifier being connected to a square pulse generator based on the well known meander generator circuit. In this case means 8 for recording the mean value of the current through the p-n junction 3 is a voltmeter measuring average values of a voltage and having a well-known bridge circuit diagram.

This embodiment of the apparatus is advantageous in that it provides for control of the current-voltage characteristics of the p-n junctions of semiconductor devices on the basis of the comparison with the current-voltage characteristics of the p-n junction of reference semiconductor devices.

Another modification of the apparatus allowing the operator to control the quality of semiconductor devices by the coefficient $m$ of deviation from of its current-voltage characteristic the reference current-voltage characteristic specified by a non-linear element is similar to that described above.

Its distinctive feature consists in that the voltage converter 9 (FIG. 9), in addition to the differentiating unit built around an operational amplifier 24, comprises a summing amplifier 37. The amplifier 37 comprises an operational amplifier 38 having a resistor 39 inserted into the negative feedback circuit thereof. The output of the amplifier 37 is connected to the input of the differentiating unit, while its first input is connected to the p-n junction 3 via a resistor 40. The second input of the amplifier 37 is connected via a resistor 41, to the controller 7 thus providing an additional coupling 10 of the converter 9 with the controller 7.

Figure 8:
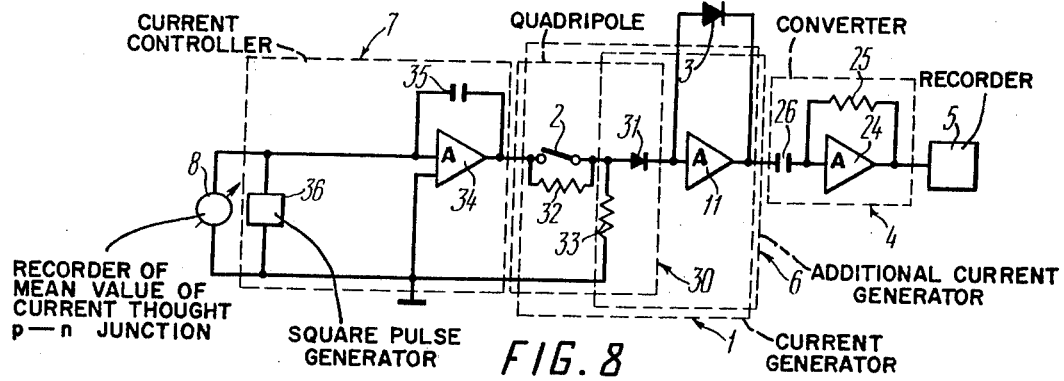
FIG. 8 is the same, with a quadripole comprised of a non-linear element according to the invention.

The above-described apparatus, as compared with that shown in FIG. 8, makes it possible to obtain at the input of the recorder 5 a signal proportional to the ratio of the difference in the coefficient $m$ for the reference p-n junction (diode 31) and the p-n junction 3 being tested to the coefficient $m$ of this reference junction.

In still another embodiment the apparatus similar to that described above solvs the same problem.

Its distinctive feature consists in that the voltage generators 1 and 6 comprise an operational amplifier 42 (FIG. 10) with balanced inputs having the negative feedback circuit including the p-n junction 3 of the semiconductor device being tested and also in that it has a quadripole 43 employing a diode 31 connected to the inverting input (−) of the amplifier 42. A non-inverting input (+) of the operational amplifier 42 is alternately connected, via a switching element 2, which in this case is a circuit breaker, either to the current controller 7 or to the earth, while the inverting input is earthed through a diode 31 having a reference current-voltage characteristic.

The voltage converter 9 in this embodiment of the apparatus, in addition to the differentiating unit, comprising an operational amplifier 24, comprises a differential amplifier 44 based on an operational amplifier 45 with balanced inputs and with a resistor 45 inserted into its negative feedback circuit. The inverting input (−) of the amplifier 45 is connected, via a resistor 47, to the p-n junction of the device being tested, and the non-inverting input (+) is connected to the current controller via a resistor 48 and a switching element 2 thus providing an additional electric coupling 10.

Figure 9:
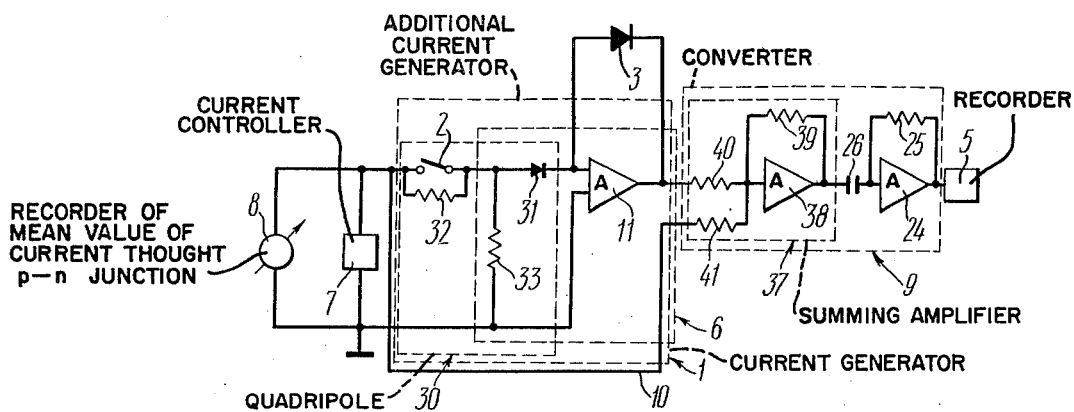
FIG. 9 is the same, with a summing amplifier effecting additional electric coupling of the converter with the current controller according to the invention.
Figure 10:
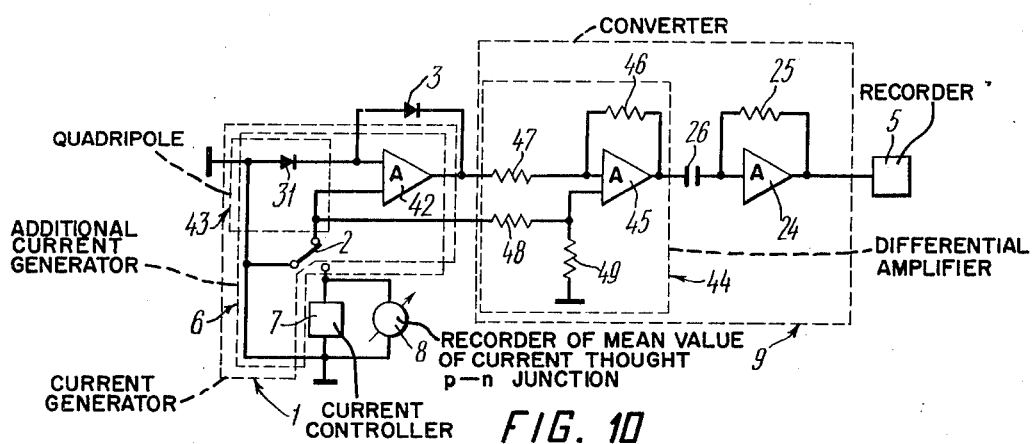
FIG. 10 is the same, with a differential amplifier according to the invention.

The apparatus presented in FIGS. 9 and 10 can be made without a differentiating unit. Here the inputs of the summing and differentiating amplifiers 37 and 44, respectively, are directly connected to the input of the recorder 5. In this case the current controller 7 is a DC voltage source.

When the quality control is effected by using a limited number of points of the current-voltage characteristic of the p-n junction, at which the value of the coefficient $m$ of deviation is controlled, the use mode of an embodiment including additional current generators whose is greater than unit but is yet limited. This embodiment is similar to that shown in FIG. 3. Its distinction consists in that the switching element 2 (FIG. 11) in a quadripole 50 comprises a multiple switch for n positions. In this embodiment the operational amplifier 11, together with a resistor 51 of the quadripole 50, forms a main current generator 1, and, together with a resistor 52 of this quadripole, forms one of the additional current generators 6. In this case $n-2$ of the remaining additional current generators are formed by the operational amplifier 11 and $n-2$ resistors shown in the drawing with dotted line, respectively. The values of the resistances of said resistors are selected such that the values of the currents of the current generators should provide for constant voltage increments voltage across the p-n junction 3 having an ideal current-voltage characteristic when switching over two resistors with adjacent value of resistances.

All the above-described embodiments of the apparatus for effecting quality control of semiconductor devices can to the same advantage be used for controlling integrated circuits.

The apparatus for effecting the method of quality control of semiconductor devices and integrated circuits containing at least one p-n junction according to the invention operates as follows.

The switching element 2 (FIG. 1) alternately connects the current generators 1 and 6 to the p-n junction 3 at different output current values. As a result, a certain average current $I = (I_1 + I_6)/2$ (here $I_1$ and $I_6$ are currents at the outputs of the generators 1 and 6, respectively) will flow through the p-n junction 3 with a superimposed AC component whose peak-to-peak amplitude is equal to the difference of the currents $I_1 - I_6 = \Delta I$. Since the current generators 1 and 6 have a common current controller 7, the ratio $\Delta I/I$ is always constant upon any variation of the current I and, therefore, the amplitude of the AC component has a value which can be found from relationship (6). In other words, as it was shown above, the amplitude of the AC component is proportional to the coefficient $m$ of deviation of the current-voltage characteristic of the p-n junction 3 of the semiconductor device being tested. Means 8 for recording the means value of the current I is employed for maintaining this current within the limits specified by inequality (2).

Thus, the readings of the recorder 5 (FIGS. 3–5) comprising an AC voltmeter calibrated in relative values are used for evaluating the coefficient $m$ and, should this value be not within the range from 1 to 2, the semiconductor device or integrated circuit is considered defective and rejected.

The specific embodiment of the apparatus effecting the method of quality control of semiconductor devices and integrated circuits functioning by the method wherein a direct current with an AC component superimposed thereon is passed through the p-n junction (FIG. 3) operates in the following manner.

When the switching element 2 comprising a circuit breaker is in the upper position, to the input of the operational amplifier 11 there is applied a current defined by the quotient from the division of the value of the voltage at the output of the controller 7 by the value of the resistance of the resistor 13. This current is not directly branched to the amplifier 11 due to the "virtuality of the earth" at the input of this operational amplifier 11 having the feedback circuit including the p-n junction 3 being controlled. Owing to this fact, almost the entire current flowing through the resistor 13 will pass through the p-n junction 3 and this is equivalent to the connection of the p-n junction 3 to the current generator 1. When the switch is in the lower position, the additional resistor 14 is connected in series with the resistor 13 so that the input current of the amplifier 11 is reduced. Consequently, the current flowing through the p-n junction 3 will jump down, and this is equivalent to connection of this junction to the current generator 6. Since in both cases the currents are defined by the same input voltage of the current controller 7, the currents will vary simultaneously with variations in this voltage. This makes it possible to keep the ratio $\Delta I/I$ constant since in this case the equality of the relative variations of currents $I_1$ and $I_2$ of the main and additional current generators is ensured (the switching element 2 is correspondingly in the upper and the lower positions) due to the fact that both currents are directly proportional to the voltage of the voltage generator which is a current controller 7. Since the relative variations of currents $I_1$ and $I_2$ are equal a similar relative variation in the difference between $I_1$ and $I_2$ is also ensured, i.e. $\Delta I = I_1 - I_2$, and, therefore, the ratio $\Delta I/1 = $ const. This fact ensures the proportionality of the voltage variable component across the p-n junction to the coefficient $m$ for any current $I = (I_1 + I_2)/2$ determining the point at the current-voltage characteristic of the p-n junction at which said coefficient is being measured. The voltage across the p-n junction 3, which is substantially equal to the input voltage of the operational amplifier 11 since its input voltage is close to zero at sufficiently high gain of this amplifier, will be proportional to the coefficient m in view of the above-given reasons.

Figure 3:
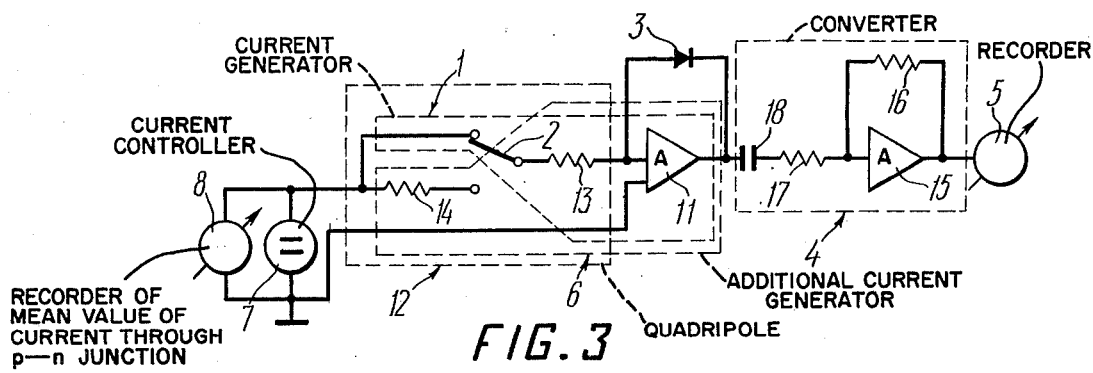
FIG. 3 is a circuit diagram of the first embodiment of the apparatus according to the invention with a resistive quadripole.
Figure 4:
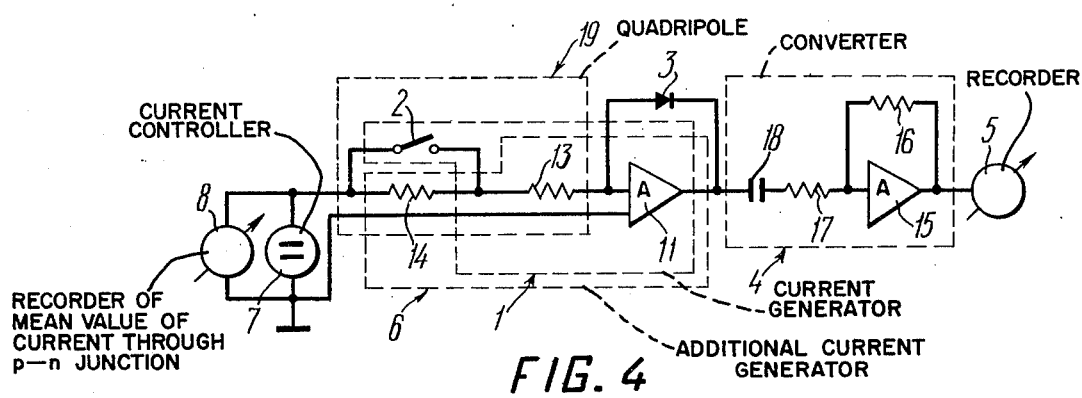
FIG. 4 is the same, with another embodiment of the quadripole.
Figure 5:
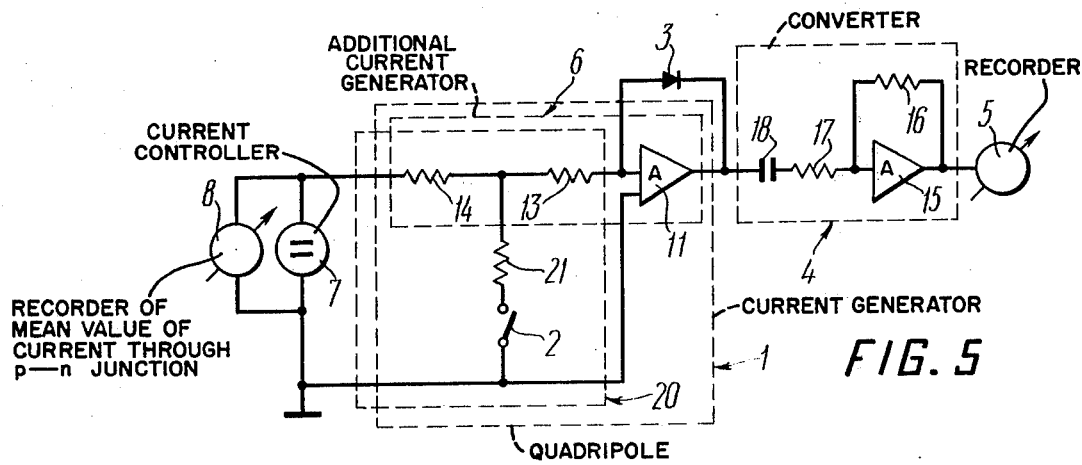
FIG. 5 is the same, with the third embodiment of the quadripole.

The operation of the apparatus shown in FIGS. 4 and 5 does not materially differ from the operation of the apparatus shown in FIG. 3. In all these apparatus the voltage converter 4 is an AC voltage amplifier with a gain defined by expression (7), whereby the calibration of the recorder 5 is facilitated, which in this case comprises an AC voltmeter.

With the resistive quadripole 19 (FIG. 4) having two resistors 13 and 14 connected in series, the switching element 2 comprises a circuit breaker and this simplifies practical embodiment of the proposed apparatus.

When the quadripole 20 (FIG. 5) employs three resistors 13, 14 and 21, the circuit breaker can be controlled with reference to the low earth potential and this enables the use of a transistor as said circuit breaker.

When effecting the method of quality control of semiconductor devices and integrated circuits having a p-n junction by means of a system in which there is used an exponential form of the current passed through the p-n junction, the exponential current can be obtained by means of the capacitor 23 (FIG. 6). This apparatus operates as follows.

When the switching element 2 is closed, the current flowing through the p-n junction 3 is determined by the resistor 13 and the DC voltage of the controller 7, what is similar to the apparatus shown in FIG. 3 with the switch is in the upper position. In this case the capacitor 23 is charged up to the output voltage of the current controller 7. When the switch contacts are open, the capacitor 23 is exponentially discharged with the time constant defined by its capacitance and the values of resistances of the resistors 13 and 14. The voltage appearing during the discharge of the capacitor 23 produces an exponentially varying current at the input of the operational amplifier 11, and this current flows through the p-n junction 3 without being branched to the input of the operational amplifier 11. At the end of the discharge, the current flowing through the p-n junction 3 is determined by the resistances of the resistors 13 and 14 so that there is provided a minimum current flowing through the p-n junction 3 causing a voltage drop of the order of $4\phi_t$ in accordance with inequality (2). Therefore, the value of the output voltage of the current controller 7 is selected such that the upper limit of the current should not exceed the value specified by the same inequality (2). It is evident that if the current-voltage characteristic of the p-n junction 3 is exponential, the output voltage of the amplifier 11 (i.e. the voltage across the junction 3), would be linear with time. However, due to the fact that the current-voltage characteristic of the p-n junction 3 differs from the exponential one, the time-dependent variations of the output voltage of the amplifier 11 will differ from linearity. Therefore, after the differentiation of the voltage by the unit 4, at pulses, whose amplitude follows the way of the dependence of the coefficient $m$ on the value of the current through the p-n junction 3 will appear at the output thereof. In the described apparatus the value of the coefficient $m$ is recorded by a recorder 5 comprising an oscillograph or a stroboscopic voltmeter used for measurement of the instantaneous values of the amplitude of the pulses appearing at the output of the differentiating unit 4.

The apparatus shown in FIG. 7 operates substantially in the same manner as that described above. The only difference consists in the fact that the exponential current pulse appears when closing the switch contacts. The presence of the resistor 29 provides for a current decrease at the p-n junction 3 not to a certain allowable minimum value according to inequality (2), rather that to zero.

The modification of the apparatus in which the quadripole 30 (FIG. 8) connected to the input of the operational amplifier 11 comprises a diode 31 as nonlinear element operates as follows.

The switching element 2 comprising a circuit breaker alternately connects the current controller 7 comprising a saw tooth generator to a diode 31. In this case the current flowing through the diode 31 will change by the law close to the exponential law. The same current will flow through the p-n junction 3 due to the action of the operational amplifier 11. The output voltage of the amplifier 11, which is substantially equal to the voltage across the p-n junction 3, is differentiated by means of the differentiating unit 4, and the signal from the output of the unit 4 is fed to the recorder 5.

The above-described embodiment of the apparatus is advantageous in that the current-voltage characteristic of the p-n junction 3 is tested in comparison with the actual reference current-voltage characteristic of the diode 31.

In those cases where it is necessary to provide for relative control of the coefficient $m$, i.e. to obtain the signal $(m-m_e)/m_e = \Delta m/m_e$; wherein $m$ is coefficient of deviation of the current-voltage characteristic of the p-n junction of the semiconductor device or integrated circuit being tested from the ideal characteristic, $m_e$ is coefficient of deviation of the current-voltage characteristic of the reference diode from the ideal characteristic, the embodiments of the apparatus shown in FIGS. 9 and 10 are used. In this case the voltage of the current controller 7 is substracted from the voltage appearing across the p-n junction so that the resolving power of these apparatus is higher than the resolution of the apparatus shown in FIG. 8.

Indeed, if the current-voltage characteristics of the diode 31 and the p-n junction 3 are identical, the output voltage of the amplifier 11 is a replica of the voltage of the current controller 7. Therefore, in the ideal case at the output of the substractor unit there would zero voltage. In this case the summing amplifier 37 (FIG. 9) and the differentiating amplifier 44 (FIG. 10) function as substractor unit. Their output voltages can be either fed directly to the recorder 5 or differentiated, as it is done, by means of the differentiating unit.

The summing amplifier 37 (FIG. 9) is used because the output voltage of the current controller 7 and the output voltage of the operational amplifier 11 are opposite in phase.

Despite of the fact that in the apparatus shown in FIGS. 9 and 10 the resulting output information of the coefficient $m$ is obtained in the form of $(m - m_e)/m_e$ because $m_e$ value is specified, the selection of the range of the allowable values of $m$ for prediction of the service life of semiconductor devices having at least one p-n junction is based on inequality $m_{min} \leq m \leq m_{max}$, wherein $m_{min} \leq 1$ and $m_{max} \geq 2$, wherefrom the boundary values of the relative deviations $(m - m_e)/m_e = \Delta m/m_e$ are derived.

The embodiment of the apparatus having $n$ current generators operates as follows.

The switching element 2 (FIG. 11) comprising a multiple switch operates so that, after connecting one of the $n$ resistors of the quadripole 50 to the input of the operational amplifier 11 via the resistor 13, it will alternately connect to this input, for a certain time period two resistors with adjacent values of the resistances thus superimposing an AC component in the form of square pulses on the DC component of the current flowing through the p-n junction 3.

In this case the principle of operation of this apparatus for each of the $n$ fixed values of the DC component of the current flowing through the p-n junction 3 does not differ from the principle of operation of the apparatus, in which the coefficient $m$ is measured by passing through the p-n junction 3 (FIG. 3) a current with a DC and AC components.

At the same time, it is quite clear that when selecting the resistances of the $n$ resistors providing for $n$ constant voltage increments across the p-n junction, the exponential dependence of the discrete values of the DC component of the current flowing through the p-n junction 3 (FIG. 11) on the position of the multiple switch, i.e. on $n$ is actually obtained. Thus, with $h \rightarrow \infty$ there will be specified a current having a form of exponential pulses and flowing through the p-n junction, as is the case in the apparatus shown in FIGS. 7-10. It is obvious that in this case the voltage increments across the p-n junction will tend to zero. Therefore, to obtain the information of the coefficient $m$, the apparatus shown in FIGS. 7-10 employ a differentiating unit as voltage converter.

The apparatus shown in FIGS. 3 to 6 are advantageous in that they make it possible to measure the coefficient $m$ of deviation "statically" at each point of the current-voltage characteristic of the p-n junction by means of an analog of digital voltmeter employed as recorder 5. The advantage of the apparatus shown in FIGS. 7 to 10 is the possibility of observation of the dependence of the coefficient $m$ of deviation on the current on the screen of an oscillograph employed as recorder 5.

Figure 11:
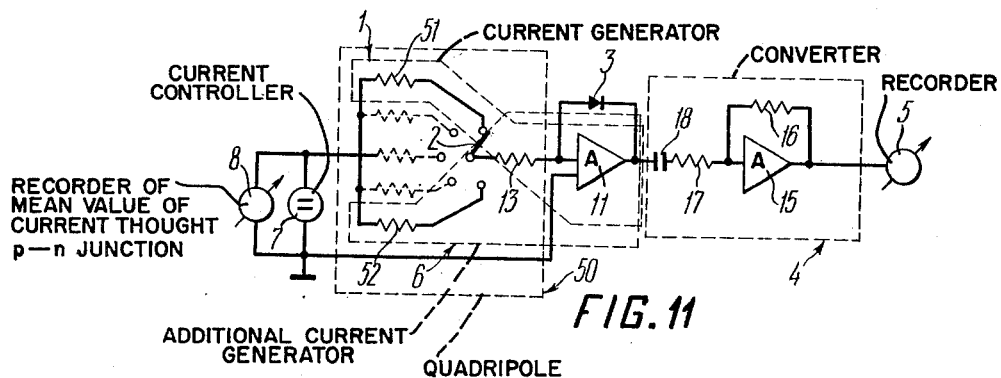
FIG. 11 is a circuit diagram of the first embodiment of the apparatus according to the invention with $n-1$ additional current generators.

The device presented in FIG. 11 makes it possible both to measure the coefficient $m$ of deviation at any point of the current-voltage characteristic with recording of this point during any time interval, i.e. statically and to observe the dependence of this coefficient in the form of a set of discrete values for $n$ fixed values of the DC component of the current flowing through the p-n junction 3.

The use of the known parameter $m$ as a quality criterion in performing the quality control of semiconductor devices and integrated circuits in the method according to the invention provides for reliable quality control both at stage of manufacture of semiconductor devices and integrated circuits and at the stage of their acceptance. The present invention is especially valuable for equipment using semiconductor devices and integrated circuits which is intended for long-term use operation. The method and the apparatus according to the invention provide for direct, rapid and accurate measurement of the coefficient $m$, as well as the possibility of observation of the dependence of $m = f(I)$ over a very broad range of forward currents flowing through the p-n junction.

The method and apparatus according to the invention enable a 100% control of semiconductlr devices and integrated circuits at high speed over the whole specified range of currents flowing through the p-n junction. The apparatus has a simple electric circuit, small size and does not require special skill. It may be expediently used in scientific and research laboratories for analysis of troubles in semiconductor devices and integrated circuits as well.

What is claimed is:

1. A method for quality control of semiconductor devices and integrated circuits having at least one p-n junction, comprising using as a criterion of quality a coefficient $m$ of deviation of the actual current-voltage characteristic from the ideal one lying in the range of $m_{min} \leq m \leq m_{max}$, wherein $m_{min} \leq 1$, while $m_{max} \geq 2$; passing a current through the p-n junction in the forward direction in the range defined by the relationship $$I/U \geq 4\Phi_T < I < \frac{\Phi_T}{R_b},$$

wherein
U is voltage drop across the p-n junction;
$\phi$ is thermal potential equal to $kT/q$;
$R_b$ is resistance in the base circuit of the p-n junction including the external resistance;
measuring the voltage amplitudes across the p-n junction caused by the passage of said current, said voltage increments being proportional to said coefficient $m$ of deviation of the actual current-voltage characteristic obtained when passing said current through the p-n junction from the ideal characteristic.

2. A method as claimed in claim 1 comprising selecting said current passed through the p-n junction in the forward direction to have such a form as to provide for constant voltage increments across the p-n junction with an ideal current-voltage characteristic; obtaining the information of the value of said coefficient $m$ for the p-n junctions of the semiconductor devices and integrated circuits on the basis of the degree of variation of said constant voltage increments.

3. A method as claimed in claim 2, comprising selecting said current passed through the p-n junction to have a form defined by the pressure of DC and AC components; maintaining the ratio between said DC and AC components constant; evaluating said coefficient $m$ by the amplitude of the AC component of the voltage across the p-n junction.

4. A method as claimed in claim 2, comprising selecting said current passed through the p-n junction to have a form of exponential pulses; differentiating voltage pulses appearing across the p-n junction; evaluating said coefficient $m$ by the instantaneous values of the pulse amplitude obtained after said differentiation.

5. An apparatus for quality control of semiconductor devices and integrated circuits having at least one p-n junction comprising: current generators with interconnected control inputs; a current controller whose output is connected to said control inputs of said generators and whose signal is used for interdependently varying the output currents of said generators; means for recording the mean value of the current flowing through the p-n junction being tested, said means being connected in parallel with said current controller; a switching element, the p-n junction being alternately connected to said generators by means of said switching element; a voltage converter connected to the p-n junction and converting the voltage taken from this p-n junction into an electric signal, the conversion factor of said voltage converter depending on the form of the current flowing through the p-n junction and on its mean value; a recorder recording the value of the coefficient $m$ of deviation of the actual current-voltage characteristic of the p-n junction from the ideal one, said recorder being connected to the output of said voltage converter.

6. An apparatus as claimed in claim 5, wherein said voltage converter is additionally electrically coupled to the output of said current controller.

7. An apparatus for quality control of semiconductor devices and integrated circuits having at least one p-n junction, comprising: an operational amplifier; a negative feedback circuit of said amplifier including the p-n junction of the semiconductor device being tested; a current whose form is defined by the presence of DC and AC components, being passed through the p-n junction; a resistive quadripole connected to the input of said operational amplifier; a switching element of said quadripole, said resistive quadripole providing for the passage through said p-n junction of at least two varying interdepently currents by means of said switching element; a DC generator whose output is connected to the input of said resistive quadripole; means for recording mean value of the current flowing through the p-n junction, said means being connected in parallel with said DC generator an AC amplifier with a gain proportional to the ratio of the mean value of the current to the difference in the currents at the output of said operational amplifier, said AC amplifier being connected to the output of said operational amplifier; a recorder recording the value of the coefficient $m$ of deviation of the actual current-voltage characteristic of the p-n junction from the ideal characteristic, said recorder being connected to the output of said AC amplifier.

8. An apparatus for quality control of semiconductor devices and integrated circuits having at least one p-n junction, comprising: an operational amplifier; a negative feedback circuit of said amplifier including the p-n junction of the semiconductor device being tested; a current having a form of exponential pulses being passed through said p-n junction; a quadripole connected to the input of said operational amplifier; reactive elements of said quadripole; active elements of said quadripole electrically connected to said reactive elements; a current controller whose output is connected to the input of said quadripole; a switching element of said quadripole, said quadripole, together with said controller, providing for the passage of current having said form of exponential pulses through said p-n junction by means of said switching element; means for recording mean value of the current flowing through the p-n junction, said means being connected in parallel with said current controller; a differentiating unit connected to the output of said operational amplifier; a recorder recording the value of the coefficient $m$ of deviation of the actual current-voltage characteristic of the p-n junction from the ideal characteristic, said recorder being connected to the input of said differentiating unit.

9. An apparatus for quality control of semiconductor devices and integrated circuits having at least one p-n junction, comprising: an operational amplifier; a negative feedback circuit of said amplifier including the p-n junction of the semiconductor device being tested, a current having a form of exponential pulses being passed through said p-n junction; a quadripole connected to the input of said operational amplifier; non-linear elements of said quadripole; a current controller whose output is connected to the input of said quadripole; a switching element of said quadripole, said quadripole, together with said controller, providing for the passage of current having said form of exponential pulses through said p-n junction by means of said switching element; means for recording mean value of the current flowing through the p-n junction, said means being connected in parallel with said current controller; a differentiating unit connected to the output of said operational amplifier; a recorder recording the value of the coefficient $m$ of deviation of the actual current-voltage characteristic of the p-n junction from the ideal one, said recorder being connected to the output of said differentiating unit.

10. An apparatus as claimed in claim 9 comprising: a summing amplifier whose input is connected to the input of said differentiating unit and whose output is connected to the input of said recorder; an additional electric coupling between said differentiating unit and said controller via said summing amplifier.

11. An apparatus as claimed in claim 9 comprising: a differential amplifier whose input is connected to the input of said differentiating unit and whose output is connected to the input of said recorder; an additional electric coupling between said differentiating unit with said controller via said differential amplifier.

12. An apparatus for quality control of semiconductor devices and integrated circuits having at least one p-n junction comprising: an operational amplifier; a negative feedback circuit of said amplifier including the p-n junction of the integrated circuit being tested, a current whose form is defined by the presence of DC and AC components being passed through said p-n junction; a resistive quadripole connected to the input of said operational amplifier; a switching element of said quadripole, said resistive quadripole providing for the passage of at least two currents through said p-n junction that vary interdependently by means of said switching element; a DC voltage generator whose output is connected to the input of said resistive quadripole; means for recording mean value of the current flowing through the p-n junction connected in parallel with said DC voltage generator; an AC voltage amplifier with a gain proportional to the ratio of the mean value of the current to the difference in the input currents of said operational amplifier, said AC voltage amplifier being connected to the output of said operational amplifier; a recorder recording the value of the coefficient $m$ of deviation of the actual current voltage characteristic of the p-n junction from the ideal characteristic connected to the input of said AC voltage amplifier.

13. An apparatus for quality control of semiconductor devices and integrated circuits having at least one p-n junction comprising: an operational amplifier; a negative feedback circuit of said amplifier including the p-n junction of the integrated circuit being tested, a current having a form of exponential pulses being passed through said p-n junction; a quadripole connected to the input of said operational amplifier; reactive elements of said quadripole; active elements of said quadripole electrically connected to said reactive elements; a current controller whose output is connected to the input of said quadripole; a switching element of said quadripole, said quadripole, together with said controller, providing for the passage of an electric current having said form of exponential pulses through the p-n junction by means of said switching element; means for recording mean value of the current flowing through the p-n junction, said means being connected in parallel with said current controller; a differentiating unit connected to the output of said operational amplifier; a recorder recording the value of coefficient $m$ of deviation of the actual current-voltage characteristic of the p-n junction from the ideal one connected to the output of said differentiating unit.

14. An apparatus for quality control of semiconductor devices and integrated circuits having at least one p-n junction comprising: an operational amplifier; a negative feedback circuit of said amplifier including the p-n junction of the integrated circuit being tested, an electric current having a form of exponential pulses being passed through said p-n junction; a quadripole connected to the input of said operational amplifier; non-linear elements of said quadripole; a current controller whose output is connected to the input of said quadripole; a switching element of said quadripole, said quadripole, together with said controller, providing for the passage of electric current having a form of said exponential pulses through said by means of said switching element; p-n junction; means for recording mean value of the current flowing through the p-n junction, said means being connected in parallel with said current controller; a differentiating unit connected to the input of said operational amplifier; a recorder recording the value of the coefficient $m$ of deviation of the actual current-voltage characteristic of the p-n junction from the ideal one connected to the output of said differentiating unit.

15. An apparatus as claimed in claim 14, comprising: a summing amplifier whose input is connected to the input of said differentiating unit and whose output is connected to the input of said recorder; an additional electric coupling between said differentiating unit and said controller via said summing amplifier.

16. An apparatus as claimed in claim 14 comprising: a differential amplifier whose input is connected to the input of said differentiating unit and whose output is connected to the input of said recorder; an additional electric coupling between said differentiating unit and said controller via said differential amplifier.

* * * * *